United States Patent [19]

Cifuentes et al.

[11] Patent Number: 5,352,491

[45] Date of Patent: Oct. 4, 1994

[54] METHOD FOR COATING USING MOLTEN ORGANOSILOXANE COMPOSITIONS

[75] Inventors: Martin E. Cifuentes; Michael R. Strong; Bernard Vanwert, all of Midland, Mich.

[73] Assignee: Dow Corning Corporation, Midland, Mich.

[21] Appl. No.: 75,987

[22] Filed: Jun. 11, 1993

[51] Int. Cl.$^5$ .............................................. B05D 3/10
[52] U.S. Cl. ...................................... 427/387; 525/477
[58] Field of Search ........................... 427/387; 525/477

[56] References Cited

U.S. PATENT DOCUMENTS

| | | | |
|---|---|---|---|
| 2,814,601 | 11/1957 | Currie et al. | 260/29.1 |
| 4,143,088 | 3/1979 | Favre et al. | 260/825 |
| 4,780,338 | 10/1988 | Saad et al. | 427/387 |
| 4,800,127 | 1/1989 | Saad et al. | 428/447 |
| 4,865,920 | 9/1989 | Sweet | 427/208.2 |
| 4,988,779 | 1/1991 | Medford et al. | 525/478 |
| 4,990,364 | 2/1991 | Bolte et al. | 427/386 |
| 5,034,061 | 7/1991 | Maquire et al. | 525/477 |
| 5,070,121 | 12/1991 | Hinter et al. | 524/31 |
| 5,091,484 | 2/1992 | Colas et al. | 525/477 |
| 5,162,410 | 11/1992 | Sweet | 427/387 |

FOREIGN PATENT DOCUMENTS

| | | |
|---|---|---|
| 529841 | 3/1993 | European Pat. Off. . |
| 0481487 | 3/1992 | Japan . |

*Primary Examiner*—Shrive Beck
*Assistant Examiner*—Erma Cameron
*Attorney, Agent, or Firm*—Robert Spector

[57] ABSTRACT

Organosiloxane compositions comprising specified combinations of MQ resins and liquid polyorganosiloxanes can be applied as molten materials to form coatings that are non-flowable under ambient conditions and can initially be remelted by heating the coating above its flow transition temperature. In the presence of moisture, the flow transition temperature of the coating gradually increases due to the reaction of hydrolyzable groups on the polyorganosiloxane ingredient until the coating is converted to a non-flowable resin reinforced elastomer. Preferred coatings are non-transferable at 25° C. within ten minutes following application.

10 Claims, No Drawings

METHOD FOR COATING USING MOLTEN ORGANOSILOXANE COMPOSITIONS

BACKGROUND OF THE INVENTION

1. Field of The Invention

This invention relates to a method for applying protective silicone coatings to substrates. More particularly, this invention involves heating a specified class of moisture reactive organosiloxane compositions to a flowable state and applying the compositions as coatings to a substrate, whereupon the compositions cool and become non-flowable. The initially applied coatings can be made flowable by heating but in the presence of atmospheric moisture gradually convert to a resin-reinforced elastomeric material that is not reflowable with heating to temperatures well above the application temperature. Many of the coatings can be handled at ambient temperature within minutes after being coated without damage to the coating or transfer of coating material.

The cured coatings provide long term protection for substrates against harsh environments at temperatures above the application temperature of the initial coating.

2. Background Information

Many combinations of resinous and liquid polymers are known. Some of these exhibit the properties characteristic of pressure sensitive adhesives, also referred to as PSA's.

PSA's based on organosilicon compounds typically contain 1) a silicone resin containing specified concentrations of monofunctional $R_3SiO$ units, referred to as M units, and tetrafunctional $SiO_{4/2}$ units, referred to as Q units, and 2) a high molecular weight polydiorganosiloxane having the consistency of a gum. These compositions are typically applied as a solution in a compatible organic liquid or a low viscosity, liquid nonreactive polyorganosiloxane. Following application of the solution to a desired substrate the liquid is evaporated to deposit the PSA.

U.S. Pat. No. 2,814,601, issued to Currie et al. describes curable silicone PSA's useful for bonding silicone rubber to metals such as aluminum, and which cure to a permanent adhesive at room temperature even in the absence of moisture.

U.S. Pat. No. 4,865,920, which issued to R. Sweet, describes solventless silicone PSA's that can be applied as a heated melt, also referred to as a hot melt. The compositions differ from prior art PSA's by replacement of the gum type polydiorganosiloxane with a liquid polydiorganosiloxane and by addition of from 1 to 10 percent, based on the combined weight of the organosilicon compounds, of a liquid ester of a monocarboxylic acid containing from 2 to 32 carbon atoms. Replacing this ester with a phenyl-containing polysiloxane fluid to make the PSA more compatible with drugs and other organic materials is described in U.S. Pat. No. 5,162,410, which issued to R. Sweet.

The hot melt PSA's described in both Sweet patents do not contain moisture activated reactive groups capable of forming a cured material, and therefore retain the flowability at elevated temperatures and the tackiness characteristic of PSA's.

A commonly assigned copending application, Ser. No. 07/748,848, filed on Aug. 22, 1991 describes silicone PSA's that cure in the presence of moisture to permanent adhesives. The compositions are particularly useful as structural adhesives for adhering glass panels to structural materials such as concrete, aluminum and steel. The two required ingredients of the PSA are an MQ resin and a high consistency polydiorganosiloxane gum wherein at least 50 percent and preferably at least 90 percent of the silicon-bonded hydrocarbon radicals are methyl.

One or both ingredients of the PSA compositions described in the aforementioned copending application contain moisture activated curing groups of the formula $R_b(OR')_{3-b}SiZ-$, where R represents a monovalent hydrocarbon radical, R' represents an alkyl or aryl radical, Z is a divalent group that durably links the curing group to a silicon atom of one of the PSA ingredients and the value of h is 0 or 1. Typical linking groups that can be represented by Z include but are not limited to oxygen, one or more diorganosiloxane units, and hydrocarbylene radicals that optionally contains one or more hetero atoms selected from oxygen, nitrogen and sulfur.

Due to the high viscosity of gum type polydiorganosiloxanes even at elevated temperatures, the moisture curable PSA compositions are not suitable for application as heated molten materials, but instead are applied to substrates as solutions in a miscible organic solvent such as xylene. The solvent is removed prior to curing of the composition or evaporates during the curing reaction.

Japanese laid open patent application (Kokai) No. 4(1992)-/81,487 describes curable pressure sensitive adhesive compositions comprising (1) 100 parts by weight of an organosiloxane copolymer consisting essentially of triorganosiloxy and $SiO_{4/2}$ units and up to 0.7 weight percent of silanol groups, where the molar ratio of triorganosiloxy to $SiO_{4/2}$ units is from 0.6 to 1.2, respectively, (2) a liquid polydiorganosiloxane containing as the terminal units alkoxy, alkenyloxy, iminoxy, acyloxy and/or aminoxy radicals, and (3) a condensation catalyst to promote curing of the composition in the presence of atmospheric moisture. The molar ratio of silanol groups in the resinous copolymer to terminal units in the liquid polydiorganosiloxane is from 1 to 10.

The characterizing feature of the moisture reacting compositions described in the Japanese patent application is their ability to retain the characteristics of pressure sensitive adhesives under both dry and wet conditions following reaction of the moisture reactive groups. This requires that the molar ratio of silanol units in the resinous copolymer to terminal units in the liquid polydiorganosiloxane be from 1 to 10, and preferably from 4 to 8.

U.S. Pat. No. 5,091,484, which issued to A. Colas on February 25, 1992 describes elastomer-forming compositions containing (1) a hydroxyl- or alkoxy-terminated polydiorganosiloxane (2) an alkoxy-functional MQ type silicone resin that is preferably liquid under ambient conditions and (3) a titanium-containing curing catalyst. These compositions are described as flowable under ambient conditions and cure in the presence of atmospheric moisture to yield elastomeric materials.

Moisture curable elastomer-forming compositions containing (1) a hydroxyl-terminated polydiorganosiloxane (2) an MQ type silicone resin containing from 0.5 to 6 weight percent of hydroxyl groups, (3) alkoxy-functional organosilicon compounds as the curing agent, and (4) a titanium-containing curing catalyst are described in U.S. Pat. No. 4,143,088, which issued to G. Favre et al. on Mar. 6, 1979.

Organic polymer compositions that are solid under ambient conditions and sufficiently flowable when heated to be applied as coatings that can subsequently be cured by a free radical reaction are described in U.S. Pat. No. 4,990,364, which issued to Bolte et al., U.S. Pat. No. 5,070,121, which issued to Hinterwaldner et al., and Japanese Laid Open Application 89/251,837.

Moisture curable organic polymer compositions that form conventional or pressure sensitive adhesives and can be applied as heated melts are described in Published European Patent Application No. 0420864. The compositions comprise a silane-modified copolymer of ethylene and a polar monomer such as vinyl acetate, a catalyst and an optional plasticizer. The modified polymers contain silicon-bonded hydrolyzable groups.

Patent application WO 91/08420, filed under the provisions of the Patent Cooperation Treaty, describes adhesive compositions containing a tackifier resin or tackifier wax that has been modified by reaction with a silane containing hydrolyzable groups that are present in the final resin or wax. The composition optionally contains an organic polymer with groups capable of reacting with the silicon-bonded hydrolyzable groups to form a crosslinked material.

When curable compositions applied in the molten state are used as protective coatings, the cooled uncured compositions should preferably exhibit sufficient adhesion and sufficiently low tackiness to allow the coated articles to be handled immediately or shortly following application of the coating composition without damage to the coating or transfer of coating material to objects that contact the articles.

When the substrate is a printed circuit board, to correct coating defects and make repairs to the electronic components mounted on the coated substrate it is desirable that at least the interior portion of the coating remain reflowable upon heating for a limited time period while curing under ambient conditions to ultimately form a crosslinked, non-reflowable elastomeric material exhibiting excellent adhesion to the substrate, as demonstrated by a resistance to corrosion of metal surfaces and articles on the substrate.

With the increasing emphasis on eliminating or at least reducing the amount of volatile materials released during the application and curing of coating compositions, there has been a growing demand for curable compositions that can be applied in the absence of solvents or diluents.

It is therefore an objective of the present invention to provide moisture reactive coating compositions that are substantially free of unreactive liquid materials and can be heated for application as molten liquids that upon contacting a substrate at ambient temperature rapidly form solid coatings exhibiting strong adhesion to clean or contaminated substrates without requiring priming or other surface preparation. The initially applied coatings are reflowable upon heating and in the presence of moisture under ambient conditions are gradually converted to substantially tack-free resin-reinforced elastomeric materials that are not reflowable even at temperature substantially above their application temperature and maintain their initial adhesion to the substrate.

SUMMARY OF THE INVENTION

The present inventors discovered that the objectives of this invention can be achieved using organosiloxane compositions containing combinations of organosiloxane MQ resins and liquid polyorganosiloxanes of specified viscosity and functionality. Preferred compositions exhibit excellent adhesion to a variety of organic and metallic substrates.

DETAILED DESCRIPTION OF THE INVENTION

This invention provides a method for applying a coating at least one surface of a substrate, the method comprising the sequential steps of I) causing a curable coating composition to become flowable by heating the composition above its flow-transition temperature, where the coating composition comprises (a) a resinous organosiloxane copolymer exhibiting a number average molecular weight of at least 1000 and comprising monovalent $R^1{}_3SiO_{\frac{1}{2}}$ units, tetravalent $SiO_{4/2}$ units and up to six weight percent, based on the weight of said copolymer, of $XSiO_{3/2}$ units, where X is at least one member selected from the group consisting of hydroxyl groups, hydrolyzable groups and trihydrocarbylsiloxy groups, and (b) a polyorganosiloxane that is liquid at 25° C. and contains an average of more than two hydrolyzable groups per molecule, where $R^1$ represents a monovalent unsubstituted or substituted hydrocarbon radical, at least 80 percent of the repeating units of said polyorganosiloxane are disiloxane units, and the amount of said resinous organosiloxane copolymer relative to said polyorganosiloxane is sufficient for 1) a coating consisting essentially of a 0,075 mm-thick vertical layer of said composition to be substantially nonflowable at 25° C., and 2) said composition to have a flow transition temperature within the range from 40° to 200° C. prior to reaction of said hydrolyzable groups, II) applying said composition as a flowable material to a surface of a substrate to form a coating, and III) exposing the coating to moisture for a time sufficient to react said hydrolyzable groups and increase the flow transition temperature of said composition by at least 10° C.

At least a portion of the hydrolyzable groups present on the polyorganosiloxane ingredient, referred to as ingredient (b), can be derived from silanol groups on an initial reactant. In this instance the curable composition contains at least an equimolar quantity, based on the number of silanol groups, of a silane or other low molecular weight organosilicon compound having at least three hydrolyzable groups per molecule. It will be understood that a reaction will occur between the silane and the silanol groups present in the precursor to ingredient (b), particularly if a catalyst promoting this reaction is present in the composition.

Ingredients of the Curable Organosiloxane Compositions

The ingredients present in the curable organosiloxane compositions used as coating materials in accordance with the present method include but are not limited to at least one resinous organosiloxane copolymer comprising triorganosiloxy and $SiO_{4/2}$ units, referred to as MQ resins, and at least one polyorganosiloxane with a viscosity of from 0.02 to 100 Pa.s at 25° C.

The present method is based on the identification of certain MQ resins and liquid polyorganosiloxanes and a range of relative concentrations within which these ingredients form a flowable melt at temperatures from 40° to about 200° C. and are non-flowable at about 25°

C. The melt can be applied as a coherent, uniform layer on a variety of organic and inorganic substrates using conventional coating techniques.

As the temperature of the present compositions decreases from the temperature at which it flows to the temperature of the substrate, typically about 25° C., there appears to be a temperature or a narrow temperature range where the composition undergoes a transition from a material that flows as a useful coating material to one that does not flow or "sag" within about a one minute period when applied on a vertical substrate. For the present compositions this layer is preferably about 0.003 inch (0.075 mm) thick. Lower viscosity compositions will gradually drip off the surface when applied in this thickness.

Another way of defining the non-flowing characteristic of the curable compositions at 25° C. is that when a 60 cc capacity jar is filled with a molten composition of this invention to one-third of its capacity, the melt is allowed to solidify, and the jar is then placed on its side, there is no evidence of flowing during a twenty minute period. This is equivalent to a minimum room temperature dynamic viscosity in the approximate range of from $2 \times 10^7$ to $8 \times 10^7$ centipoise (20 to 80 kPa.s) when measured at 1 radian/sec.

In the presence of moisture the hydrolyzable groups on at least the polyorganosiloxane ingredient of the present compositions react to gradually convert the compositions to substantially tack-free resin-reinforced elastomeric materials that will no longer flow at the temperature used to apply the coating. During at least the initial stages of this conversion the flow transition temperature of the composition does not appreciably increase, and the composition can be reflowed by heating to temperatures of from 60° to 200° C.

During conversion of the present compositions from materials that flow at elevated temperatures to non-flowable resin reinforced elastomers by reaction of the hydrolyzable groups, the flow transition temperature of the composition increases by at least 10° C., preferably by at least 50° C., relative to the initial composition. In most instances the final composition may soften but will not flow at temperatures up to 200° C.

The flow characteristics of the present curable compositions change when heated above their flow transition temperature to the extent that they can readily be extruded from a conventional dispensers used to apply "hot melt" compositions. The dynamic viscosity of the present compositions decreases to not more than about 10 Pa.s at a temperature not exceeding 200° C.

Preferred compositions become non-transferable within ten minutes after cooling to ambient temperature on the surface of the substrate. As used in this specification, the term "nontransferable" that characterizes preferred coating compositions implies that when an object at ambient temperature contacts the surface of a coating that has cooled to the temperature of the substrate, no material is transferred from the coating to the object.

The flow transition temperature and other rheological properties of a composition of this invention can be varied by selection of a particular MQ resin, also referred to herein as "resin", and polyorganosiloxane, also referred to in the specification as "polymer", and by varying the relative concentrations of these two ingredients.

It should be understood that inclusion of two or more different resins and polymers will affect not only the flow characteristics of the blend but also the properties of the product obtained following reaction of the hydrolyzable groups present on at least the polymer ingredients to form a crosslinked resin reinforced elastomer.

The relative concentrations of resin and polymer required to achieve the optimum combination of properties that characterizes the present compositions is dependent at least in part on the molecular weights of these ingredients.

A convenient way of expressing the range of relative concentration ranges for MQ resin and liquid polyorganosiloxane is in terms of the melt viscosity of the mixture prior to reaction of the hydrolyzable groups, which is typically less than about 10 Pa.s at the temperature used to apply coatings in accordance with the present method. This is in addition to the aforementioned requirements that a 0.003 inch-thick layer of the composition is non-flowable on a vertical surface under ambient conditions once the composition has cooled to the temperature of the substrate, and that the composition remains reflowable with heating during at least the early stages of the conversion to a resin-reinforced elastomer.

For preferred combinations of MQ resins and liquid polyorganosiloxanes encompassed by the present invention the resin constitutes from 40 to 80 percent of the combined weight of the resin and the liquid polyorganosiloxane. Compositions containing less than about 40 weight percent of even the highest molecular weight resins are flowable at 25° C., even when the resin is the highest molecular weight that will form a flowable composition in accordance with the present method. Compositions containing more than about 80 weight percent of even the lowest molecular weight resins are difficult to process using conventional melt coating techniques at temperatures up to 200° C. or form coatings that are often brittle, even with the lowest molecular weight resins suitable for use in accordance with the present method.

Curing agents and/or curing catalysts can be part of the present composition. The requirement for the presence of these materials to form a useful coating is dependent upon the types of reactive groups present on the resinous copolymer(s), the liquid polyorganosiloxane(s) and the desired curing reaction.

The Resinous Copolymer (MQ Resin)

The resinous copolymer constitutes one of the two types of organosiloxane materials present in compositions used in the present method. The resins contain monofunctional (M) units represented by the formula $R^1_3SiO_{\frac{1}{2}}$ and tetrafunctional (Q) units represented by the formula $SiO_{4/2}$. $R^1$ represents a substituted or unsubstituted monovalent hydrocarbon radical Resins of this type are well known in the art as one of the ingredients present in organosiloxane compositions used as pressure sensitive adhesives.

The MQ resins are soluble in liquid hydrocarbons such as benzene, toluene, xylene, heptane and the like or in liquid organosilicon compounds such as a low viscosity cyclic and linear polydiorganosiloxanes.

In the $R^1_3SiO_{\frac{1}{2}}$ or M units $R^1$ represents a monovalent hydrocarbon radical containing preferably up to 20 carbon atoms, and most preferably from 1 to 10 carbon atoms.

Examples of suitable hydrocarbon radicals for $R^1$ include alkyl radicals, such as methyl, ethyl, propyl, pentyl, octyl, undecyl and octadecyl; alkenyl radicals, such as vinyl, allyl and 5-hexenyl; cycloaliphatic radicals, such as cyclohexyl and cyclohexenylethyl; and aryl radicals such as phenyl, tolyl, xylyl, benzyl and 2-phenylethyl. Typical substituted hydrocarbon radicals that can be represented by $R^1$ include chloromethyl and 3,3,3-trifluoropropyl.

At least one-third, preferably at least two-thirds of the $R^1$ radicals in the formula for the M unit of the MQ resin are methyl radicals. Examples of preferred M units include but are not limited to $HMe_2SiO_{\frac{1}{2}}$, $Me_3SiO_{\frac{1}{2}}$, $PhMe_2SiO_{\frac{1}{2}}$ and $Me_2ViSiO_{\frac{1}{2}}$ where Me, Ph and Vi denote methyl, phenyl and vinyl, respectively. The resin may contain two or more of these units.

The molar ratio of the M to Q units in the MQ resin is typically from 0.5/1 to 1.5/1, preferably from 0.6/1 to 0.9/1. These mol ratios are conveniently measured by $Si^{29}$ n.m.r. spectroscopy. This technique can be used to quantitatively determine of the molar contents of: M (resin), M(neopentamer), Q (resin), Q(neopentamer) and hydroxyl groups. For the purposes of the present invention the M/Q ratio {M(resin)+M(neopentamer)}/{Q(resin)+Q(neopentamer)} represents the ratio of the total number of triorganosiloxy groups in the resinous and neopentamer portions of the copolymer to the total number of silicate groups of the resinous and neopentamer portions of the copolymer. It will be understood that the neopentamer portion includes only that amount inherently present in the copolymer as it is prepared.

The concentration of silanol groups present in the resin can be determined using Fourier Transform Infrared Spectrophotometry (FTIR).

Silicon-bonded terminal groups that can be present in the MQ resin include but are not limited to reactive groups such as silanol, silicon-bonded hydrogen, alkenyl radicals and hydrolyzable groups that include but are not limited to alkoxy such as methoxy, alkenyloxy such as isopropenyloxy, ketoximo such as methylethylketoximo, carboxy such as acetoxy, amidoxy such as acetamidoxy and aminoxy such as N,N-dimethylaminoxy. Alternatively the terminal groups present on the resin can be unreactive groups such as trihydrocarbylsiloxy.

When reactive groups are present they typically constitute up to about 6 weight percent of the MQ resin. It will be understood that silanol groups can be present only in the absence of a suitable catalyst for the reaction of these silanol groups with the alkoxy or other hydrolyzable groups present on the polyorganosiloxane ingredient of the present compositions.

To maximize the storage stability of the present compositions under ambient conditions the silanol groups formed during preparation of the MQ resin are converted to trihydrocarbylsiloxy groups or a hydrolyzable group such as those described in the preceding section of this specification. The conversion is conveniently achieved by reacting the resin with a silane, disiloxane or disilazane containing the appropriate terminal group. Silanes containing hydrolyzable groups are typically added in excess of the quantity required to react with the silanol groups of the resin. These groups are responsible for conversion of the present compositions from materials that are flowable with heating to resin reinforced elastomers that may soften but do not flow at temperatures from 60° to 200° C.

It will be understood that if all the initialsilanol groups of the MQ resin are converted to triorganosiloxy groups by reaction with a monofunctional silane, disiloxane or disilazane the copolymer does not participate in the reaction(s) used to cure the composition.

The molecular weight required to achieve the desired flow characteristics of the MQ resin will depend at least in part on the molecular weight of the resin and the type(s) of hydrocarbon radicals, represented by $R^1$, that are present in this ingredient. For the preferred resins where $R^1$ is alkyl containing from 1 to 3 carbon atoms the number average molecular weight of the resin is preferably from 1500 to about 15,000, preferably from 2700 to 6500. The molecular weight of the MQ resin is conveniently determined using gel permeation chromatography with MQ resin standards rather than the conventional polystyrene standards.

The MQ resin can be prepared by any suitable method. Resins of this type have reportedly been prepared by cohydrolysis of the corresponding silanes or by silica hydrosol capping methods known in the art. The MQ resin is preferably prepared by the silica hydrosol capping processes of Daudt, et al., U.S. Pat. No. 2,676,182; of Rivers-Farrell et al., U.S. Pat. No. 4,611,042; and of Butler, U.S. Pat. No. 4,774,310; each of these patents being incorporated herein by reference as a teaching of preparing MQ resins which can be reacted to contain terminal groups that participate in curing of the present compositions.

The intermediates used to prepare the MQ resin are typically triorganosilanes of the formula $R^1{}_3SiX$, where X represents a hydrolyzable group, and either a silane with four hydrolyzable groups such as halogen, alkoxy or hydroxyl, or an alkali metal silicate such as sodium silicate.

Non-reactive substituents that can be present on $R^1$ include but are not limited to halogen and cyano.

To form useful coatings in accordance with the present method the resinous organosiloxane copolymer should be a tack-free solid at 25° C. and soften sufficiently at a temperature from 40° to 200° C. to flow in the presence of the other ingredients of the coating composition under the conditions used to apply the compositions in accordance with the present method.

The Polyorganosiloxane

The polyorganosiloxane ingredient of coating compositions suitable for use in accordance with the present method is a liquid at 25° C. and is composed, at least in major part, of difunctional (D) repeating units of the formula $R^2R^3SiO$. The polymers can optionally contain up to about 20 percent, based on total repeating units, of trifunctional (T) units of the formula $R^4SiO_{3/2}$. In these formulae $R^2$ represents a hydrocarbyl radical selected from the same group as $R^1$ or an alkoxy group, and $R^3$ and $R^4$ are individually selected from the same group as $R^1$.

At least 50 percent, preferably at least 80 percent, of the radicals represented by $R^2$, $R^3$ and $R^4$ are lower alkyl, most preferably methyl.

The total number of repeating units per molecule of the liquid polyorganosiloxane is equivalent to a viscosity of from 20 to 100,000 centipoise (0.02 to 100 Pa.s) at 25° C. A viscosity of from 0.05 to 25 Pa.s is preferred, and can be achieved using a single polyorganosiloxane or a mixture containing two or more polyorganosiloxanes.

The terminal units present on the liquid polyorganosiloxane can be represented by the formula $R^5{}_aY_{3-a}SiG—$, where Y is a hydrolyzable group, $R^5$ is selected from aminoalkyl in addition to the same group of substituted and unsubstituted hydrocarbon radicals as $R^1$, G represents a divalent group linking the silicon atom of the terminal unit with another silicon atom and a is 0 or 1. If no curing agent such as a silane containing at least three hydrolyzable groups per molecule is present in the curable composition, the liquid polyorganosiloxane and/or the MQ resin should contain an average of more than two hydrolyzable groups per molecule in order to form a crosslinked product.

Typical hydrolyzable groups include but are not limited to those described in the preceding section of this specification describing the resin ingredient. When a is 0, the groups represented by Y are preferably alkoxy or methylethylketoximo and $R^5$ is alkyl, such as methyl or ethyl, or aminoalkyl such as aminopropyl or 3-(2-aminoethylamino)propyl. If an amino group is present on a hydrolyzable group, the amino group can be primary, secondary or tertiary.

In the formula for the terminal unit G represents any divalent group or atom which is not hydrolyzable and links the silicon atom(s) of the terminal unit to another silicon atom of the livid polyorganosiloxane ingredient such that the terminal unit is not removed during curing of the composition and the curing reaction is not adversely affected. Hydrolytically stable linkages represented by G include but are not limited to oxygen, hydrocarbylene such as alkylene and phenylene, hydrocarbylene containing one or more hetero atoms selected from oxygen, nitrogen and sulfur, and combinations of these linking groups.

G can represent a silalkylene linkage such as —(OSiMe$_2$)CH$_2$CH$_2$—, —(CH$_2$CH$_2$SiMe$_2$)(OSiMe$_2$)CH$_2$CH$_2$—, —(CH$_2$CH$_2$SiMe$_2$)O—, (CH$_2$CH$_2$SiMe$_2$)OSiMe$_2$)O—, —(CH$_2$CH$_2$SiMe$_2$)CH$_2$CH$_2$— and —CH$_2$CH$_2$—, a siloxane linkage such as —(OSiMe$_2$)O— or an oxygen atom.

Specific examples of preferred terminal groups include but are not limited to (MeO)$_3$SiCH$_2$CH$_2$—, (MeO)$_3$SiO—, Me(MeO)$_2$SiO—, H$_2$NCH$_2$CH$_2$N(H)(CH$_2$)$_3$ SiO—, (EtO)$_3$ SiO—, (MeO)$_3$SiCH$_2$CH$_2$Si— MeCH$_2$CH$_2$SiMe$_2$O—, Me$_2$NOSiO—, MeC(O)N(H) SiO— and CH$_2$=C(CH$_3$)OSiO—. Me in these formulae represents methyl and Et represents ethyl.

In addition to the —CH$_2$CH$_2$— shown in some of the preceding terminal groups the isomeric —CH(CH$_3$)— radicals can also be present as a result of the hydrosilation reaction between a silicon bonded vinyl radical and a silicon-bonded hydrogen atom. This reaction is used to form some of the present terminal units.

A portion of the terminal units represented by $R^5_aY_{3-a}$SiG can be present on the MQ resin, depending upon whether the reactant used to form the terminal units is reacted with the MQ resin, the liquid polyorganosiloxane or a mixture of these ingredients.

The terminal units of the polyorganosiloxane and MQ resin present in the curable composition can be present on these initial reactants or the terminal units can be formed in situ by reaction of the corresponding silanol, alkenyl or SiH-groups present on the precursor polyorganosiloxane and/or MQ resin with an organosilicon compound containing the desired terminal group in addition to a group that will react with the group present on the precursor polyorganosiloxane and/or resin.

Organosilicon compounds that can be reacted with the silanol groups to form the reactive terminal groups present in the final curable composition include silanes, disiloxanes, disilazanes and functionally substituted polydiorganosiloxanes.

Silanes used to form hydrolyzable groups on the MQ resin or polyorganosiloxane can be represented by the general formula Y$_3$SiG', where G' represents a group that will react with a silanol group, SiH, or SiCH=CH$_2$ to form the desired linking group G. It will be understood that G' can be selected from the same group as Y.

Disiloxanes can be represented by the formula (Y$_3$Si)$_2$O and disilazanes by the formula (Y$_3$Si)$_2$NH.

In the following preparative methods Me represents the methyl radical for purposes of simplifying the formulae. It will be understood that other hydrocarbon radicals can be substituted for methyl.

(MeO)$_3$SiCH$_2$CH$_2$— radicals and (MeO)$_3$SiCH$_2$CH$_2$SiMe$_2$— OSiMe$_2$CH$_2$CH$_2$— radicals can be introduced into a vinyl-terminated polyorganosiloxane using organosilicon compounds having the formula (MeO)$_3$SiH and (MeO)$_3$SiCH$_2$CH$_2$SiMe$_2$OSiMe$_2$H, respectively.

Moisture reactive groups having the formulae (MeO)$_3$SiO— and Me(MeO)$_2$SiO— can be introduced into a silanol-terminated polyorganosiloxane by compounds having the formulae (MeO)$_4$Si and Me(MeO)$_3$Si, respectively. Alternatively, compounds having the formulae (MeO)$_3$SiH and Me(MeO)$_2$SiH, respectively, can be used when the polyorganosiloxane contains silanol groups or alkenyl radicals such as vinyl and a platinum group metal or a compound thereof as a hydrosilation reaction catalyst. It will be understood that other hydrolyzable groups such as alkenyloxy and carboxy can replace the alkoxy group.

The liquid polyorganosiloxanes of the present compositions are preferably polydimethylsiloxanes containing three alkoxy or ketoximo groups, or two alkoxy groups together with either an alkyl or aminoalkyl radical.

The Optional Curing Agent

Depending upon the reaction used to cure the present compositions and the reactive terminal units present on the MQ resin and the liquid polyorganosiloxane, storage stability and/or curing of the composition may be improved by the presence of a curing agent that is typically a silane of the formula $R^6_nSiZ_{(4-n)}$, where $R^6$ represents an alkyl or a phenyl radical and Z is a hydrolyzable group that reacts with the terminal groups of at least the liquid polyorganosiloxane under ambient conditions to form a cured material and n is 0 or 1. Suitable hydrolyzable groups represented by Z include but are not limited to alkoxy containing from 1 to 4 carbon atoms, carboxy such as acetoxy, ketoximo such as methylethylketoximo and aminoxy (NH$_2$O—). When the silane is used to stabilize curable compositions containing resins with $M_n$ greater than about 4000, the hydrolyzable group represented by Z is preferably ketoximo.

Suitable curing agents include but are not limited to methyltrimethoxysilane, methyltris(methylethylketoximo)silane, methyltriethoxysilane, methyltriacetoxysilane, 3(2-aminoethylamino)propyltrimethoxysilane and alkyl orthosilicates such as ethyl orthosilicate.

When the hydrolyzable group present on the polyorganosiloxane ingredient is alkoxy the present inventors discovered that the ability of the cured compositions to retain adhesion at elevated temperatures is improved when a phenyltrialkoxysilane such as phenyltrimethoxysilane is used as the silane.

The presence of sufficient silane to react with at least a portion of the silanol groups on the MQ resin has been found particularly desirable using resins with molecular weights greater than about 3000 to avoid gelling during preparation of the curable composition. When the silane is used for this purpose the hydrolyzable groups present on the silane are preferably oximo or carboxy such as acetoxy, this preference being based on the higher reactivity of these hydrolyzable groups, relative to alkoxy, with the silanol groups present on the MQ resin.

The Optional Curing Catalyst

Some of the reactions used to cure the present compositions either require a catalyst or proceed at a considerably more rapid rate in the presence of a catalyst. Suitable curing catalyst will depend upon the curing reaction, and include but are not limited to tin salts of carboxylic acids, such as stannous octoate and dibutyltin dilaurate, and organotitanium compounds such as tetrabutyl titanate and partially chelated derivatives of these salts with chelating agents such as acetoacetic acid esters and beta-diketones.

The hydrolyzable groups can either all be present on the liquid polyorganosiloxane or a portion can be present on one or more silanes or other organosilicon compounds that react during curing of the composition.

To prevent premature curing of the composition it should be stored in the absence of moisture prior to being heated and applied as described in the following section of this specification.

Preparation of Curable Applications

The present compositions are prepared by blending the ingredients to homogeneity. Depending upon the molecular weights and the polymer and MQ resin, the relative concentrations of these ingredients and the silanol content of the resin, it may be desirable to pre-react the silanol groups of a precursor polymer prior to adding the MQ resin. It has been found that compositions containing resins with an average of more that about three silanol groups per molecule have a tendency to form gels in the presence of silanol-functional polymers, alkoxy functional silanes and catalysts such as organotitanium compounds.

Application of Coatings

The melt viscosity of a curable composition containing at least one each of the MQ resins and liquid polyorganosiloxanes described in the preceding sections of this specification is a convenient way of determining suitable methods for applying coatings in accordance with the present method.

Conventional coating methods suitable for use with molten materials include but are not limited to dipping, spraying, coextrusion, and spreading of viscous materials using heated doctor blades, draw-down bars and calendar rolls.

Molten materials of suitable viscosity can be extruded as preformed films onto the desired substrate, where they eventually cure under ambient conditions. Alternatively, a preformed extruded film can be solidified on a non-adhering substrate in the absence of moisture, stored in a moisture impermeable container and subsequently applied to the substrate intended to be coated. When in contact with the substrate the film is heated as required to bond it to the substrate and then exposed to moisture to convert the coating material to a resin reinforced elastomer in accordance with the present method.

Compositions with melt viscosities up to about 10 Pa.s are suitable for spraying. Spraying of molten materials typically involves forcing the material under pressure from a heated storage container through a nozzle containing one or more orifices measuring from 0.1 to 2 mm. in diameter. To assist in dispersing the stream of liquid material emerging from the nozzle the stream can be contacted with a rapidly moving current of a gas such as air or nitrogen or directed against a suitable baffle.

Depending upon the distance between the storage container and the nozzle, it may be necessary to heat the conduit connecting the nozzle or other dispensing orifice and the storage container to avoid solidification of the composition in the conduit or to blend a heated gas with the composition prior to or during passage through the conduit.

The pressure required to transport the molten material from the storage container to the dispensing orifice can be generated by admitting a pressurized gas such as dry nitrogen into the container or by equipping the container with a mechanical device such as a ram, piston or follower plate. Equipment to transport and dispense moisture sensitive materials are commercially available and can be adapted for use with the present compositions by equipping them with appropriate heating means.

Compositions with melt viscosities too high of spraying can be applied to substrates by dipping the substrate into a melt of the coating composition or dispensing molten material onto a heated substrate and allowing it to spread under its own weight or with the use of heated draw down bars or doctor blades. To avoid premature curing, the reservoir of molten material into which the substrates are dipped or from which the composition is dispensed should be maintained under a moisture-free gas such as dry nitrogen. The rate at which the substrate is withdrawn from the reservoir is determined at least in part by the viscosity of the coating composition and the desired thickness of the coating.

One advantage of the present compositions is that during the initial stage of the moisture activated conversion to a resin reinforced elastomer, imperfections and discontinuities in the initial coating can be repaired by heating the coating and/or the substrate to a temperature at which the coating composition will flow, and then reforming the coating by mechanical means using a coating bar, doctor blade, coating knife or other suitable device. A convenient method for reflowing the coating is by directing a current of heated air against the surface of the coating.

When used as a conformal coating for printed circuit boards the ability of the present compositions to be rendered flowable following application as a coating makes it possible to repair the coated surface of the substrate and repair or replace objects such as solid state devices and other electronic devices mounted on the surface of the substrate.

Coatings prepared in accordance with the present method cure slowly in the presence of the amount of moisture typically present in the atmosphere to form elastomeric materials. The time required for completion of the curing reaction ranges from several minutes to several days, depending upon the types of moisture-activated reaction, the presence of any catalysts for this reaction and the temperature of the substrate. The reactions occurring during conversion of the present moisture reactive compositions and the means for adjusting the rate of these reactions are sufficiently well understood that a detailed discussion in the specification is not required.

The method and compositions of this invention can be used to apply protective coatings to a variety of organic and inorganic substrate. Organic substrates include natural and synthetic polymers. Examples of suitable polymers include but are not limited to polyesters, polyamides, polyolefins, polycarbonates, epoxide polymers, resins derived from formaldehyde and phenols or other co-reactants, melamine resins fluorine-containing polymers such as polytetrafluoroethylene and polymers such as polysulfones and others referred to as "engineering plastics". These polymers can be reinforced with glass or ceramic fibers and other known reinforcing agents.

Inorganic substrates that can be coated using the present compositions include but are not limited to metals, particularly conductive metals such as copper and aluminum, glass and ceramics.

The adhesion, solvent resistance and electrical properties of coatings prepared in accordance with the present method make the coatings particularly useful as conformal coatings for printed circuit boards and other substrates containing electrical or electronic components, particularly if they are exposed to heat, moisture, or other adverse conditions during use. A particularly desirable property of the present coatings is their surface resistivity values, which are typically at least $10^{15}$ ohms/cm$^2$.

EXAMPLES

The following examples describe typical curable compositions for use in accordance with the present method and preferred embodiments of this method. The examples should not be interpreted as limitations on the scope of the invention defined in the accompanying claims. Unless otherwise indicated all parts and percentages in the examples are by weight and viscosities are the values measured at 25° C.

General Procedure For Preparing Curable Compositions

The amounts of polydiorganosiloxane and solubilized resin required for a particular composition together with the silane and curing catalyst, when required, were combined under ambient conditions in a glass reactor and heated at a temperature of from 50° to 60° C. for 30 minutes, at which time the temperature applied to the reactants was increased and the contents of the flask were placed under reduced pressure until the temperature of the material in the reactor reached 90° C. or 130° C. under a pressure of no more than 10 mm. Hg. In some instances the maximum temperature was maintained for from ten to 15 minutes to obtain a homogeneous molten material.

Some of the compositions were applied as coatings to copper coated substrates using a heated draw-down bar with a gap of 0.01 inch (0.25 mm). Imperfections and discontinuities in the coating resulting from agglomeration of the coating composition or other problems encountered during application of the composition were repaired by heating the coating sufficiently to cause it to flow. Heating was achieved by directing a stream of air at a temperature of from 125° to about 200° C. toward the coated surface of the substrate.

Example 1

This example describes coating compositions preferred for use in accordance with the present method and demonstrates their adhesion to copper metal and to copper metal coated with solder fluxes that can be applied without prior cleaning of the metal.

Sets of five copper plated FR-4 boards, a glass fiber reinforced epoxide composite material used as printed circuit boards by the electronics industry, were coated on one surface with a layer of one of the following "no clean" solder fluxes:

Type SM351F manufactured by Alpha Metal

Type 3590T manufactured by Hi-Grade

Type 950E manufactured by Kester

Type RMA 390 DH3 manufactured by Alpha Metal, and

Type 201C manufactured by Senju

A copper plated board that had not been coated with a solder flux was also evaluated.

After the substrates were coated on one surface with the solder paste they were coated on the same surface with one of the coating compositions described in Table 1 using a heated draw-down bar.

When allowed to cool to ambient temperature all of the compositions solidified to non-flowable materials almost immediately upon coming in contact with the substrate, and became non-transferable within 10–30 minutes after being applied. For periods ranging from 0.1 to 24 hours the compositions could be converted to flowable materials by heating them. At the end of this period the compositions had cured to form materials that could no longer be converted to flowable liquids by heating. Imperfections in the coating could be repaired by heating the substrate sufficiently to reflow the coating.

All of the coatings were between 0.125 and 0.275 mm. thick.

The coated substrates were allowed to cure for from 5 to 7 days prior to being evaluated for their ability to prevent corrosion of the substrate by the vapor in a chamber containing salt water at a temperature of 90° C. and a relative humidity of 90%. The ability of the coatings to prevent corrosion in the areas adjacent to the discontinuities produced by a pattern of incisions into the coating was used as an indication of the degree of adhesion of the coating to the substrate.

Prior to being exposed in the salt water chamber a plurality of cuts were made in the coatings on the surface that had been treated with the solder fluxes and on one surface of the control that was not coated with solder flux. The incisions formed a cross hatch pattern with lines about 1.5 mm. apart.

Following a 100—hour exposure in the salt water chamber the crosshatched areas of the samples were rated on a scale of from 0 (more than 65% of crosshatched area covered by corrosion) to 5 (no evidence of corrosion). For each combination of MQ resin and liquid polyorganosiloxane the ratings for the samples coated with the five solder fluxes and the sample without any solder flux were averaged and the resultant value appears in Table 1. The composition of the organosiloxane coatings applied to the substrates appear in the table as the percentages of MQ resin solids (resin) and liquid polydiorganosiloxane (polymer), based on the combined weight of these ingredients. These percentages exclude any solvents added together with the resin ingredient.

The MQ resins are represented by numbers and the liquid polyorganosiloxanes (polymers) by letters, in accordance with the following definitions.

Resin 1

An 81 weight percent solution in xylene of an organosiloxane copolymer exhibiting a number average molecular weight of 2700 and containing trimethylsiloxy and $SiO_{4/2}$ units in a molar ratio of 1.1:1 and about 3.2 weight percent of silicon-bonded hydroxyl groups based on the weight of the resin;

Resin 2

A 72 weight percent solution in xylene of an organosiloxane copolymer exhibiting a molecular weight of about 5000, measured using gel permeation chromatography with a resin standard, and consisting essentially of trimethylsiloxy and $SiO_2$ unit in a molar ratio of about 0.6:1 and containing about 2.6 weight percent of silicon-bonded hydroxyl groups, based on the weight of the solution;

Resin 3

A 62 weight percent solution in xylene of resin 2 wherein all but 0.8 percent of the silicon-bonded hydroxyl groups are replaced by trimethylsiloxy groups.

The number average molecular weights of the resins were determined by gel-permeation chromatography (GPC) using Varian TSK 4000+2500 columns at 35° C., a chloroform mobile phase at 1 mL/min and an IR detector set at 9.1 microns to detect Si-O-Si. The GPC was calibrated using narrow fractions of similar resins as standards. The $M_n$ values reported herein exclude any neopentamer, $(Me_3SiO)_4Si$, present in the resin component.

The trimethylsiloxy/$SiO_{4/2}$ ratio of the resins was determined by $^{29}Si$ nmr and, in this case, the reported results include any neopentamer component present in the resin.

Polydiorganosiloxane A—A 50 weight percent solution in isopropanol of a polydimethylsiloxane prepared by reacting a silanol terminated polydimethylsiloxane exhibiting a viscosity of 0.075 Pa.s with a stoichiometric excess, based on silicon-bonded hydroxyl groups, of 3(2-aminoethylamino)propyltrimethoxysilane;

Polydiorganosiloxane B—A methoxy terminated dimethylsiloxane/phenylmethoxysiloxane/phenylsilsesquioxane copolymer prepared by reacting 41 parts of phenyltrimethoxysilane with 56 parts of cyclic dimethylsiloxanes in the presence of a Lewis acid catalyst.

Polydiorganosiloxane C—A reaction product of 75 parts of a silanol terminated polydimethylsiloxane exhibiting a viscosity of about 0.04 Pa.s at 25° C. and containing about 4 weight percent silanol groups, 15 parts of 3(2-aminoethylamino)propyltrimethoxysilane and 10 parts of methyltrimethoxysilane.

Polydiorganosiloxane D—A reaction product of a silanol-terminated polydimethylsiloxane having an average degree of polymerization of 40 with a stoichiometric excess of methyl tris(methylethylketoximo)silane.

Polydiorganosiloxane E—A reaction product of a silanol-terminated polydimethylsiloxane having an average degree of polymerization of 40 with a stoichiometric excess of methyltrimethoxysilane.

Some of the compositions contained 0.5 weight percent, based on the weight of the composition, of tetrabutyl titanate (TBT) as a curing catalyst.

The reactions used to cure the compositions are represented by Roman numerals as follows:

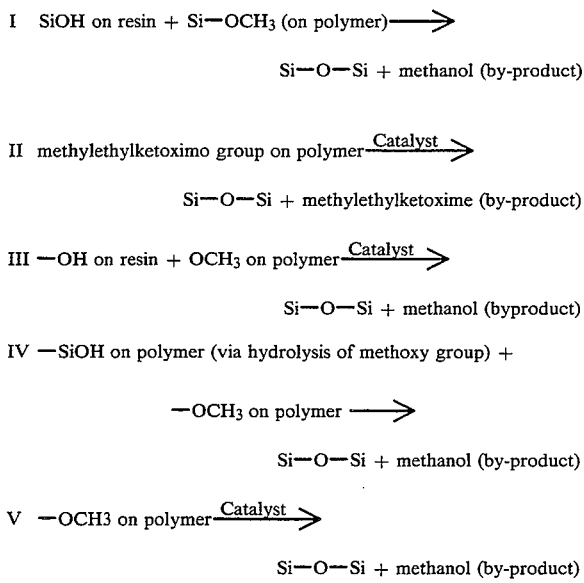

All of the compositions evaluated were non-transferable within ten minutes after being applied and could be remelted until fully cured, which required from 0.1 to 24 hours.

TABLE 1

| Cure Reaction | Composition Resin (%) | Polymer (%) | Catalyst[1] | Salt Water Corrosion |
|---|---|---|---|---|
| I[2] | 1 (72) | A (28) | None | 5 |
| I | 1 (70) | A (30) | TBT | 5 |
| I | 2 (44) | A (56) | TBT | 5 |
| II | 3 (62) | D (38) | TBT | 2 |
| III[3] | 2 (72) | B (28) | TBT | 0 |
| IV | 3 (40) | C (60) | TBT | 2 |
| V | 3 (62) | E (38) | TBT | 3 |

Notes:
[1]TBT = tetrabutyl titanate used as catalyst @ 0.5 weight percent based on total composition weight.
[2]Cracks formed in coating one month following application.
[3]Cracks formed during salt water corrosion test Example 2

This example demonstrates the effect of the molecular weight of the liquid polyorganosiloxane on the ability of a composition of this invention to be applied as a uniform coating by spraying.

Curable compositions were prepared as described in Example 1 using Resin 2 with three different methyldimethoxyterminated polydimethylsiloxanes exhibiting average degrees of polymerization (Dp) of 40, 400 and 880. The weight ratio of resin to polydimethylsiloxane was 60:40. The compositions were applied to copper plated FR-4 boards by spraying using the following procedure:

The curable composition was poured composition while molten from the reactor in which it was prepared into a cylindrical aluminum cartridge of the type used to dispense sealants. One end of the cylinder was fixed in position and contained a sealed opening through which material could be ejected from the cartridge. The other end of the cartridge was a filled with the molten curable compositions material, at which time a movable metal disk was inserted. Pressure was subsequently applied to the disk to force the contents of the cartridge through an opening made by puncturing the seal in the other end of the cartridge. The opening was sealed during cooling of the compositions, all of which were non-flowable under ambient conditions.

When the composition had solidified in the cartridge the seal of the cartridge was punctured and the cartridge placed in a sealable container equipped with an electrically operated heating element. The container was equipped with a pressure regulator that during operation exerted pressure against the movable disk of the cartridge. The cartridge container was then sealed and subsequently pressurized using compressed air.

The container was equipped with a 1.2 mm-diameter spray nozzle through which the molten composition from the cartridge was forced as a continuous stream or droplets under a pressure of 20 to 75 psig. and deposited onto a substrate located from 2 to 15 cm. from the nozzle. A compressed air outlet located at the nozzle cause the stream emerging from the nozzle to travel in a circular spiral toward the substrate.

The temperature within the cartridge container was gradually raised from 90° to 150° C. in ten degree increments. At each increment compressed air was admitted into the container, and the resultant pressure exerted by the movable disk forced composition from the cartridge through the nozzle and on to the surface of the substrate. The appearance of the resultant uncured coatings were evaluated and the results are summarized in Table 2.

None of the three compositions evaluated were both nontransferable and remeltable in the uncured form.

That which is claimed is:

1. A method for applying a coating on at least one surface of a substrate, the method comprising the sequential steps of
  I) causing a coating composition to become flowable by heating the composition above its flow-transition temperature, where the coating composition comprises
    (a) a resinous organosiloxane copolymer exhibiting a number average molecular weight of at least 1000 and comprising monovalent $R^1_3SiO_{\frac{1}{2}}$ units, tetravalent $SiO_{4/2}$ units, and up to 6 weight percent, based on the weight of said copolymer, of $XSiO_{3/2}$ units, where X is at least one member selected from the group consisting of hydroxyl groups, hydrolyzable groups and trihydrocarbylsiloxy units, and
    (b) a polyorganosiloxane that is a liquid at 25° C. and contains an average of more than two hydrolyzable groups per molecule, where $R^1$ represents a monovalent unsubstituted or substituted hydrocarbon radical, at least 80 percent of the repeating units of said polyorganosiloxane are disiloxane units, and the amount of said resinous organosiloxane copolymer relative to said polyorganosiloxane is sufficient for

TABLE 2

| Temperature | Appearance of Coating | | |
|---|---|---|---|
| (°C.) | Dp = 880 | DP = 400 | Dp = 40 |
| 90 | Chunky with globs, not spray | Few globs, few large strands, not spray | Small strands, little agglomeration |
| 100 | Globs with small strands, not spray | Small diameter strands, not a spray as applied | Nearly continuous film, few voids |
| 110 | Finer strands than Dp = 880 @ 100° C., few globs | Same as Dp = 400 @ 100° C. | Sprays well, level coating |
| 120 | Almost no globs, a few large strands | Same as Dp = 400 @ 110° C. but smaller strands | Sprays well using 0.5 mm-diameter nozzle |
| 130 | Better flow-out than Dp = 880 @ 120° C. w. few large strands | Smaller strands, less agglomeration than Dp = 400 @ 120° C. | Excellent coating, slight "orange peel" |
| 140 | Uniform, fine strands some agglomeration | Small amount of agglomeration | Same as Dp = 40 @ 130° C. |
| 150 | Uniform strands, little agglomeration | Good film with only few voids | Same as Dp = 40 @ 140° C. |

Example 3

This example demonstrates that coatings exhibiting the requirements of being both reflowable and remeltable in the uncured form cannot be prepared using resin to polyorganosiloxane ratios below the lower limit of the present method.

Curable compositions were prepared and applied to a copper-coated FR-4 board using the procedure described in Example 1 with Resin 3 and a methyldimethoxy terminated polyorganosiloxane exhibiting a Dp of 880 at resin to polyorganosiloxane weight ratios of 5:95 (A), 30:70 (B) and 40:60 (C) using tetrabutyl titanate as the curing catalyst at a concentration of 0.5 weight percent for A and 0.4 percent for B and C. The coatings were evaluated for transferability by touching them. Uncured material was still transferable from coatings prepared from A and B one hour after the coatings had been applied. The coating prepared from C did not convert to a non-transferable material until it cured, which required about one hour, and was thereafter not remeltable.

1) a coating consisting essentially of a 0.075 mm-thick vertical layer of said composition to be substantially nonflowable at 25° C., and
  2) said composition to have a flow transition temperature within the range from 40° to 200° C. prior to reaction of said hydrolyzable groups,
  II) applying said composition as a flowable material to a surface of a substate to form a coating, and
  III) exposing the coating to moisture for a time sufficient to react said hydrolyzable groups and increase the flow transition temperature of said composition by at least 10° C.

2. A method according to claim 1 where $R^1$ contains up to 20 carbon atoms, the molar ratio of monovalent to tetravalent units in said copolymer is from 0.5:1 to 1.5:1 up to 20 percent of the repeating units in said polyorganosiloxane are trifunctional units, with the remainder being diorganosiloxane units of the formula $R^2R^3SiO$, where $R^2$ is an alkoxy group or a monovalent unsubstituted or substituted hydrocarbon radical, $R^3$ is a monovalent unsubstituted or substituted hydrocarbon radical, the terminal units present on said polyorganosiloxane are represented by the formula $R^5{}_1Y_{3-a}SiG$ where $R^5$ is selected from the group consisting of aminoalkyl radicals and monovalent unsubstituted and substituted hydrocarbon radicals, Y is a hydrolyzable group, G represents a divalent group linking the silicon atom of the terminal unit with another silicon atom and a is 0 or 1, the viscosity of said polyorganosiloxane is from 0.02 to 100 Pa.s at 25° C., said resinous organosiloxane copolymer constitutes from 40 to 80 percent of the combined weight of said copolymer and said polyorganosiloxane and said layer is 0.075 mm thick.

3. A method according to claim 2 where $R^1$ contains from 1 to 10 carbon atoms, the molar ratio of monovalent to tetravalent units in said copolymer is from 0.6 to 0.9; the number average molecular weight of said copolymer is from 1500 to 15,000; at least 50 percent of the hydrocarbon radicals represented by $R^2$, $R^3$ are lower alkyl; $R^5$ is lower alkyl or aminoalkyl; the viscosity of said polyorganosiloxane at 25° C. is from 0.05 to 25 Pa.s; Y is selected from the group consisting of alkoxy, ketoximo, alkenyloxy, carboxy, amidoxy and aminoxy when a is 0 and Y is alkoxy when a is 1; G is oxygen; the melt viscosity of said composition at the temperature at which said composition is applied to said substrate is less than 10 Pa.s, and an uncured coating formed using said composition is non-transferable under ambient conditions within 10 minutes after being applied.

4. A method according to claim 3 wherein $R^1$ is selected from the group consisting of alkyl, substituted alkyl, alkenyl, cycloalkyl and aryl radicals; the X groups on said copolymer are hydroxyl and said composition contains a stoichiometric excess relative to said hydroxyl groups of hydrolyzable groups on the polyorganosiloxane; the number average molecular weight of said copolymer is from 2700 to 6500, the terminal groups present on said polyorganosiloxane are selected from the group consisting of trimethoxysiloxy, methyldimethoxysiloxy, and aminopropyldimethoxysiloxy; at least 50% of $R^2$ and $R^3$ are methyl, said composition includes a curing agent containing an average of more than two silicon-bonded hydrolyzable groups per molecule.

5. A method according to claim 4 where said curing agent is a silane of the formula $R^6{}_nSiZ_{4-n}$, where Z represents a hydrolyzable group that reacts with the terminal groups present on said polyorganosiloxane, $R^6$ is a hydrocarbon radical selected from the same group as $R^1$, and n is 0 or 1.

6. A method according to claim 5 where said composition contains a catalyst to facilitate curing of said composition, $R^6$ is alkyl, Z is alkoxy, alkenyloxy, carboxy, ketoximo, or aminoxy and at least one third of the hydrocarbon radicals represented by $R^1$ are methyl.

7. A method according to claim 5 where Z is alkoxy containing from 1 to 4 carbon atoms and said layer is applied by spraying or by spreading said composition over a surface of said substrate using an applicator heated to a-temperature above the softening temperature of said composition.

8. A method according to claim 1 where the flow transition temperature of said composition is increased by at least 50° C. degrees following reaction of said hydrolyzable groups.

9. A method according to claim 8 where the flow transition temperature of said composition following reaction of said hydrolyzable groups is at least 200° C.

10. A method according to claim 1 where said composition is prepared by
1) preparing said polyorganosiloxane by reacting a polyorganosiloxane containing silanol groups at the terminal positions with a silane of the formula $R^6{}_nSiZ_{4-n}$ where $R^6$ represents an alkyl or phenyl radical, n is 0 or 1, and Z is a hydrolyzable group that reacts with said silanol groups in the presence of a suitable catalyst and
2) adding said copolymer to the resultant reaction mixture.

* * * * *